(12) United States Patent
Lee et al.

(10) Patent No.: US 11,709,392 B2
(45) Date of Patent: Jul. 25, 2023

(54) DISPLAY DEVICE

(71) Applicant: Samsung Display Co., Ltd., Yongin-si (KR)

(72) Inventors: Donghee Lee, Hwaseong-si (KR); Seung-won Park, Seoul (KR); Baek Hee Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/545,305

(22) Filed: Aug. 20, 2019

(65) Prior Publication Data

US 2020/0183224 A1 Jun. 11, 2020

(30) Foreign Application Priority Data

Dec. 7, 2018 (KR) .................. 10-2018-0156956

(51) Int. Cl.
*G02F 1/1335* (2006.01)
*H01L 33/50* (2010.01)
*B82Y 20/00* (2011.01)

(52) U.S. Cl.
CPC ...... *G02F 1/133514* (2013.01); *H01L 33/502* (2013.01); *B82Y 20/00* (2013.01)

(58) Field of Classification Search
CPC ..... G02F 2001/133614; G02F 2202/36; G02F 1/133617
See application file for complete search history.

(56) References Cited

U.S. PATENT DOCUMENTS

| 7,213,958 B2 | 5/2007 | Ouderkirk et al. |
| 9,810,942 B2 | 11/2017 | You et al. |
| 10,126,484 B2 | 11/2018 | Jeon et al. |

(Continued)

FOREIGN PATENT DOCUMENTS

| JP | 2016181474 | 10/2016 |
| KR | 10-2016-0084009 | 7/2016 |

(Continued)

OTHER PUBLICATIONS

Abe et al., "Transparent conductive film having sandwich structure of gallium-indium-oxide/silver/gallium-indium-oxide", Science Direct—www.sciencedirect.com, 2007, pp. 3897-3900.

(Continued)

*Primary Examiner* — Richard H Kim
(74) *Attorney, Agent, or Firm* — H.C. Park & Associates, PLC

(57) ABSTRACT

A display device including a light source member including a plurality of light emitting units emitting a first color light, an optical member disposed on an upper side of the light source member, and a liquid crystal display panel disposed on an upper side of the optical member. The optical member includes a base substrate, a color conversion layer disposed on the base substrate and including a quantum dot for converting the first color light into a second color light and a third color light, a filter layer disposed between the base substrate and the color conversion layer and transmitting the first color light and reflecting the second color light and the (Continued)

third color light, and an optical path changing layer disposed on at least one of an upper surface and a lower surface of the filter layer.

16 Claims, 12 Drawing Sheets

(56) References Cited

U.S. PATENT DOCUMENTS

| | | | |
|---|---|---|---|
| 2009/0231847 A1* | 9/2009 | Pan | G02B 6/0023 362/240 |
| 2015/0131311 A1* | 5/2015 | Wheatley | G02B 6/0051 362/606 |
| 2015/0219936 A1* | 8/2015 | Kim | G02F 1/133602 362/97.1 |
| 2016/0003998 A1 | 1/2016 | Benoit et al. | |
| 2016/0033823 A1* | 2/2016 | Lee | G02F 1/133617 349/71 |
| 2016/0195773 A1* | 7/2016 | Lee | G02F 1/133504 349/71 |
| 2017/0269435 A1 | 9/2017 | Yoon et al. | |
| 2019/0025647 A1* | 1/2019 | Cheng | G02F 1/133512 |
| 2019/0278134 A1* | 9/2019 | Okamoto | G02F 1/133526 |
| 2020/0241361 A1* | 7/2020 | Mukaigaito | G02F 1/133611 |
| 2021/0371676 A1* | 12/2021 | Kim | C09D 7/20 |

FOREIGN PATENT DOCUMENTS

| | | |
|---|---|---|
| KR | 10-1767009 | 8/2017 |
| KR | 10-2017-0108192 | 9/2017 |

OTHER PUBLICATIONS

Gong et al., "Thickness Dispersion of Surface Plasmon of Ag Nano-thin Films: Determination by Ellipsometry Iterated with Transmittance Method," University of Science and Technology of China, 2015, pp. 1-5.

Meshram et al., "Enhanced transmittance of ITO_Ag(Cr)_ITO (IAI) multi-layered thin films by high temperature annealing," Materials Letters, Jan. 2015, pp. 120-124.

Guillen et al., "Transparent conductive ITO_Ag_ITO multilayer electrodes deposited by sputtering at room temperature," Optics Communications, 2009, pp. 574-578.

Guillen et al., ITO_metal_ITO multilayer structures based on Ag and Cu metal films for high-performance transparent electrodes, 2008, pp. 938-941.

* cited by examiner (Related Art)

DISPLAY DEVICE

CROSS-REFERENCE TO RELATED APPLICATION

This application claims priority from and the benefit of Korean Patent Application No. 10-2018-0156956, filed on Dec. 7, 2018, which is hereby incorporated by reference for all purposes as if fully set forth herein.

BACKGROUND

Field

Exemplary embodiments of the invention relate generally to a display device and, more specifically, to a liquid crystal display device having an optical layer with a quantum dot.

Discussion of the Background

Various types of display devices are used to provide image information and, as a result of its low power consumption, a liquid crystal display is widely used in large display devices and portable display devices.

A liquid crystal display device generates an image using light provided from a backlight unit, and the backlight unit includes a plurality of light emitting units for emitting light. On the other hand, in order to increase the light efficiency of the light provided from the light emitting units, and to improve the color reproducibility of the liquid crystal display, various types of optical members are added to the lower side of the display panel.

The above information disclosed in this Background section is only for understanding of the background of the inventive concepts, and, therefore, it may contain information that does not constitute prior art.

SUMMARY

Exemplary embodiments of the present invention provide an improvement in the display quality of a display device including a direct-type light source member.

Exemplary embodiments of the present invention also provide a display device capable of improving display quality deterioration caused by a light emitting element that is selectively turned on and off.

Additional features of the inventive concept will be set forth in the description which follows, and in part will be apparent from the description, or may be learned by practice of the inventive concept.

An exemplary embodiment of the present invention provides a display device including: a light source member including a plurality of light emitting units emitting a first color light; an optical member disposed on an upper side of the light source member; and a liquid crystal display panel disposed on an upper side of the optical member. The optical member includes: a base substrate; a color conversion layer disposed on the base substrate and including a quantum dot for converting the first color light into a second color light and a third color light; a filter layer disposed between the base substrate and the color conversion layer and transmitting the first color light and reflecting the second color light and the third color light; and an optical path changing layer disposed on at least one of an upper surface and a lower surface of the filter layer.

The plurality of light emitting units may include: a circuit board and a plurality of light emitting elements disposed on the circuit board and being turned on and off independently of each other.

The optical path changing layer may be disposed directly on an upper or lower surface of the filter layer.

The optical path changing layer may be a low refraction layer having a refractive index smaller than that of the color conversion layer.

The low refraction layer may include a low refractive index material which includes at least one of voids, hollow inorganic particles, porous silica particles, or siloxane polymers.

The low refraction layer may be a metal layer formed of a metal material of Ag, Al, Cu, or Au, or an alloy of the metal material, in which a thickness of the metal layer may be greater than or equal to 30 Å and less than or equal to 100 Å.

The metal layer may be a single layer.

The optical path changing layer may be a pattern layer including a plurality of protruding parts.

The protruding parts may protrude from the base substrate toward the color conversion layer.

The filter layer may include a plurality of first insulating films; and a plurality of second insulating films disposed alternately with the first insulating films. Refractive indices of the first insulating films and the second insulating films may be different from each other.

The refractive index of the first insulating films may be greater than or equal to 1.4 and less than or equal to 1.6. The refractive index of the second insulating films may be greater than or equal to 1.9 and less than or equal to 2.1.

The optical member may further include a barrier layer disposed on at least one of an upper surface and a lower surface of the color conversion layer.

The optical member may further include a scattering layer disposed on an upper side or a lower side of the color conversion layer.

The scattering layer may include a scattered particle of at least one of $TiO_2$, $SiO_2$, $ZnO$, $Al_2O_3$, $BaSO_4$, $CaCO_3$, or $ZrO_2$.

A center wavelength of the first color light may be in a range of 420 nm to 470 nm, inclusive. A center wavelength of the second color light may be in a range of 520 nm to 570 nm, inclusive. A center wavelength of the third color light may be in a range of 620 nm to 670 nm, inclusive.

Another exemplary embodiment of present invention provides a display device including: a light source member including a plurality of light emitting units; an optical member disposed on an upper side of the light source member; and a liquid crystal display panel disposed on an upper side of the optical member. The optical member includes: a base substrate; a color conversion layer disposed on the base substrate and including a quantum dot; and a filter layer disposed between the base substrate and the color conversion layer and configured to transmit light having a central wavelength in a range of 420 nm to 470 nm, inclusive, among an incident light, and reflect light having a center wavelength in a range of 520 nm to 670 nm, inclusive; and an optical path changing layer disposed on at least one of an upper surface and a lower surface of the filter layer.

The filter layer may reflect 80% or more of light having a center wavelength in a range of 520 nm to 670 nm, inclusive, among light incident in a normal direction of the upper surface or the lower surface.

The optical path changing layer may be a low refraction layer having a refractive index greater than or equal to 0.1 and less than or equal to 1.4 or a pattern layer containing a plurality of protruding parts.

Another exemplary embodiment of the present invention also provides a display device including: an optical member; a light source member disposed on a lower side of the optical member and including a plurality of light emitting units for providing blue light to the optical member; and a liquid crystal display panel disposed on an upper side of the optical member. The optical member includes: a base substrate; a color conversion layer disposed on the base substrate and including a first quantum dot excited by the blue light to emit green light and a second quantum dot excited by the blue light to emit red light; a filter layer disposed between the base substrate and the color conversion layer to transmit the blue light and reflect the green light and the red light; and an optical path changing layer disposed directly on at least one of an upper surface and a lower surface of the filter layer.

The optical path changing layer may be a low refraction layer having a refractive index smaller than a refractive index of the color conversion layer, or a pattern layer including a plurality of protruding parts protruding from the base substrate toward the color conversion layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
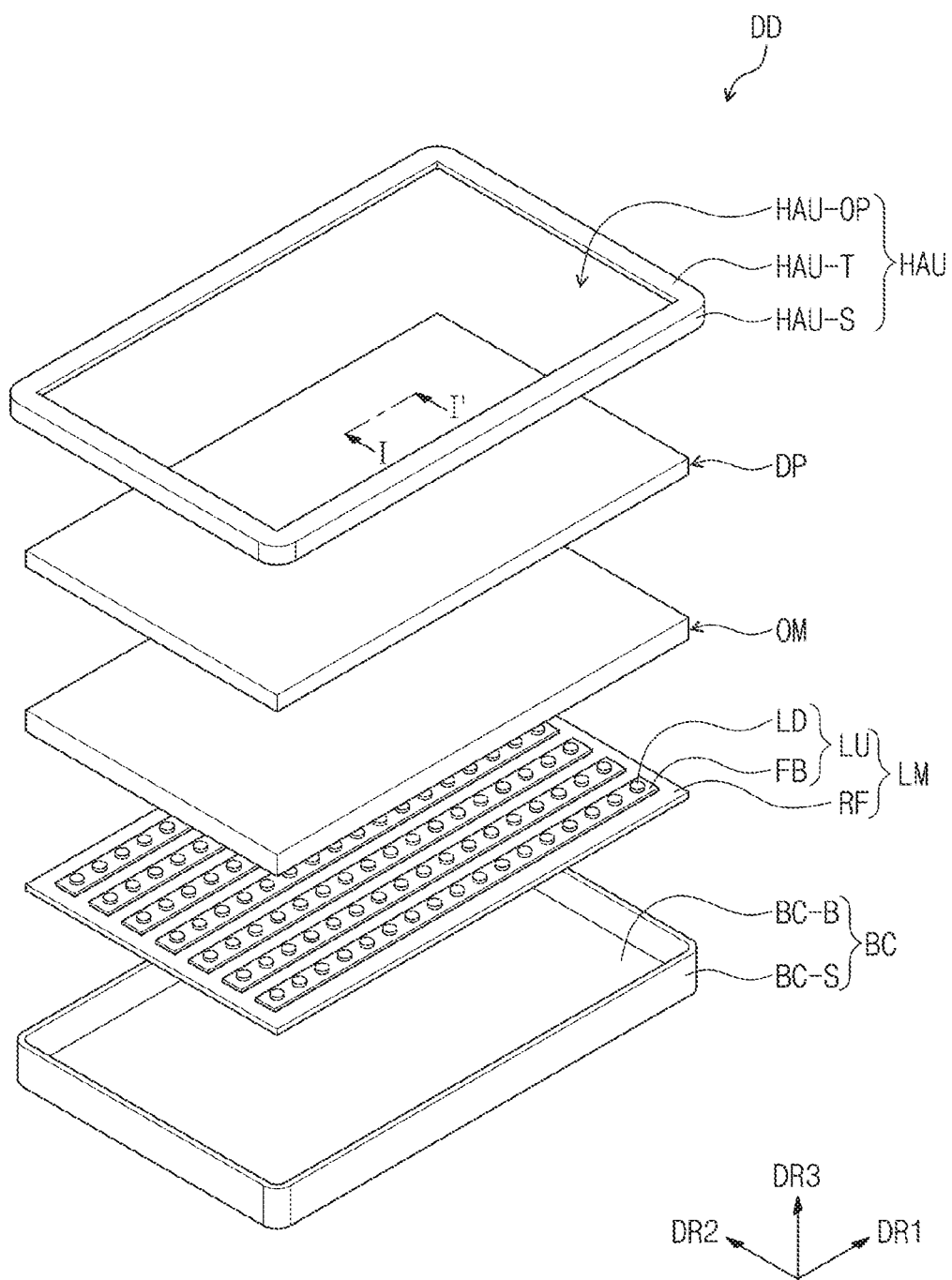
FIG. 1 is a perspective view of a display device of an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
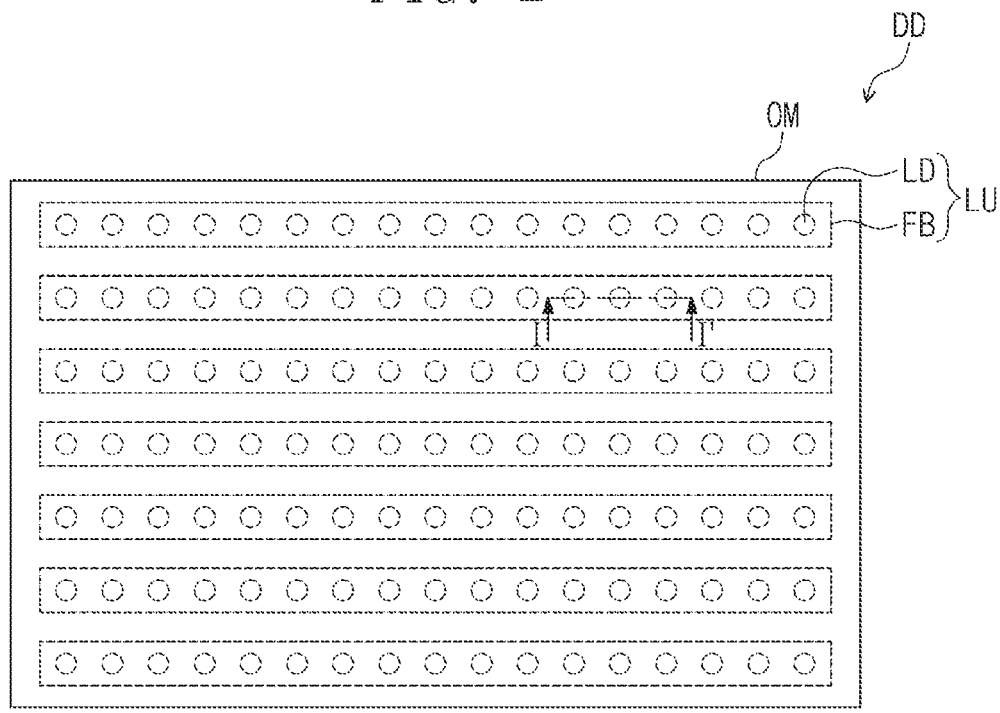
FIG. 2 is a plan view showing a part of the display device of an exemplary embodiment shown in FIG. 1.
Figure 3:
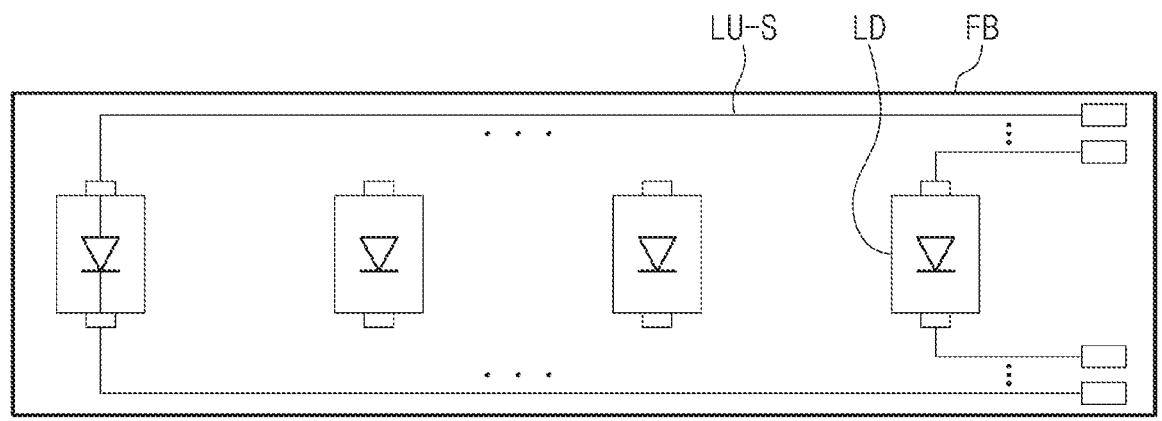
FIG. 3 is an equivalent circuit diagram of a light emitting unit according to an exemplary embodiment of the inventive concept.
Figure 4:
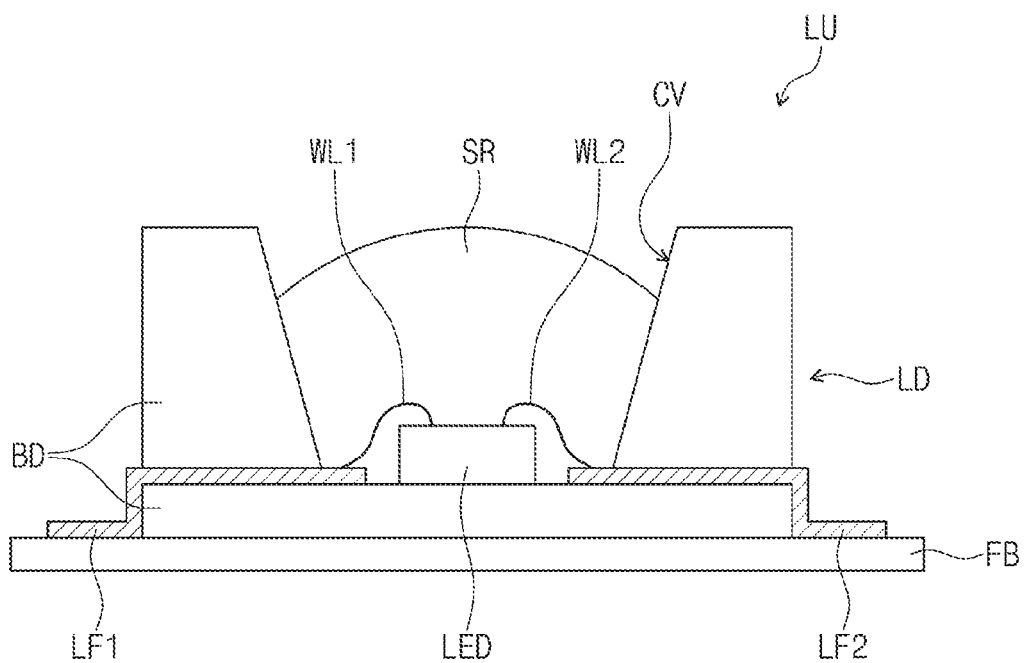
FIG. 4 is a cross-sectional view showing an exemplary embodiment of a light emitting unit included in a light source member.
Figure 5:
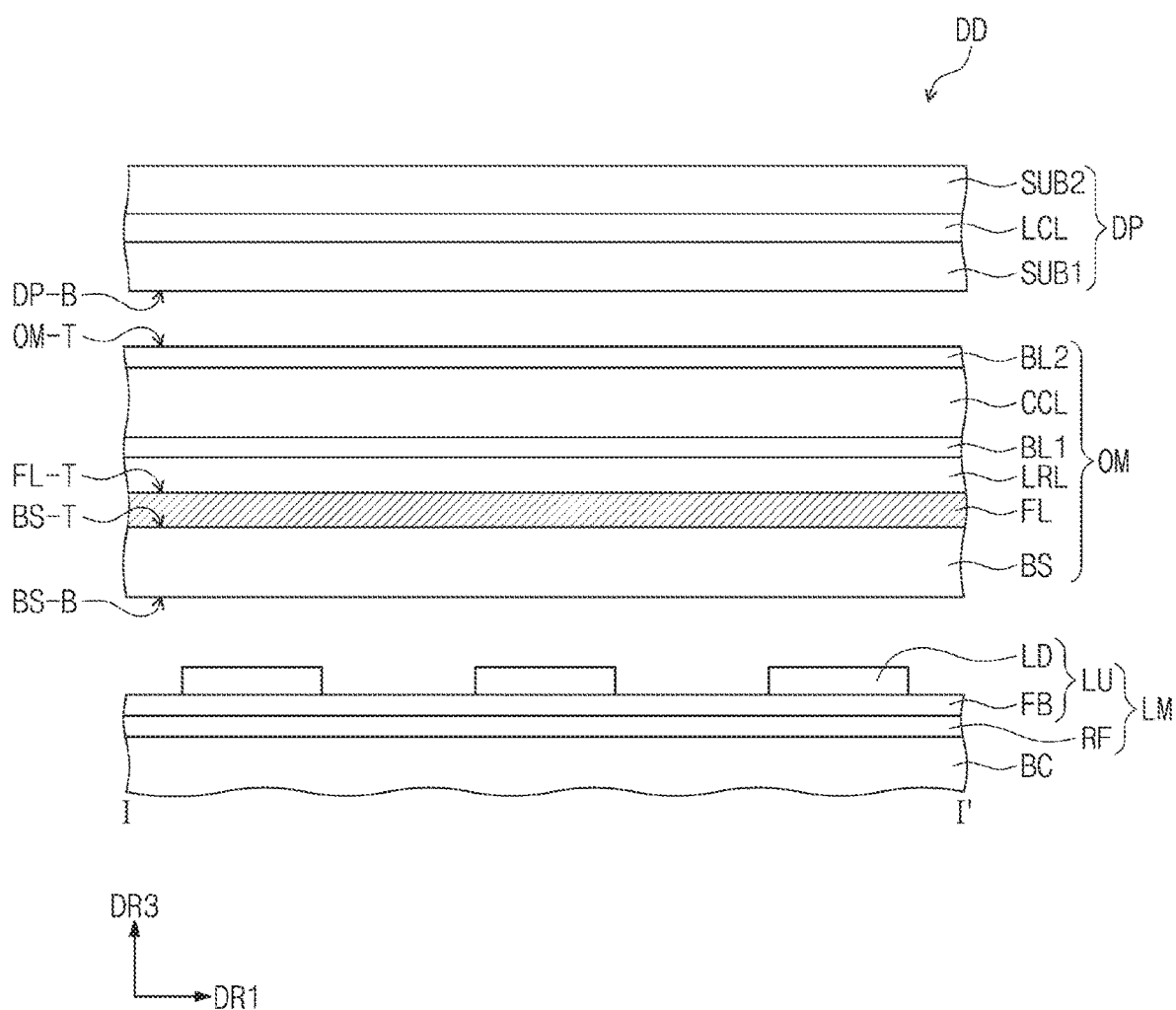
FIG. 5 is a cross-sectional view showing a display device of an exemplary embodiment of the inventive concept.

FIG. 1 is an exploded perspective view of a display device DD according to an exemplary embodiment of the inventive concept. FIG. 2 is a plan view showing a portion of a display device DD according to an exemplary embodiment of the inventive concept. FIG. 3 is an equivalent circuit diagram of light emitting units LU according to an exemplary embodiment of the inventive concept. FIG. 4 is a cross-sectional view of a light emitting unit LU according to an exemplary embodiment of the inventive concept. FIG. 5 is a cross-sectional view showing a portion corresponding to line I-I' in the display device of the exemplary embodiment shown in FIG. 1.

Referring to FIGS. 1 to 5, the display device DD of an exemplary embodiment of the inventive concept may include a light source member LM and a liquid crystal display panel DP disposed on the light source member LM. An optical member OM may be disposed between the light source member LM and the liquid crystal display panel DP. That is, the display device DD may include the light source member LM, the optical member OM, and the liquid crystal display panel DP, which are sequentially stacked in the direction of the third directional axis DR3.

A first directional axis DR1 to a third directional axis DR3 are shown in FIG. 1, and the direction axes described herein are relative. For convenience of description, in FIG. 1, the direction of the third directional axis DR3 may be defined as a direction in which the image is provided to the user. Further, the first directional axis DR1 and the second directional axis DR2 are orthogonal to each other, and the third directional axis DR3 may be a normal direction to a plane defined by the first directional axis DR1 and the second directional axis DR2.

The front surface (or upper surface, top surface) and the back surface (or lower surface, bottom surface) of each of members or units described below are separated by a third directional axis DR3. However, the first to third direction axes DR1, DR2, and DR3 shown in this exemplary embodiment are merely illustrative. Hereinafter, the first to third directions are defined as the directions indicated by the first to third direction axes DR1, DR2, and DR3, respectively, and refer to the same reference numerals.

In the display device DD of this exemplary embodiment, the liquid crystal display panel DP may overlap the light source member LM. The liquid crystal display panel DP is disposed on the upper side of the light source member LM, and the display device DD may be one having a direct light source LM. In addition, the optical member OM may be disposed between the light source member LM and the liquid crystal display panel DP to overlap the light source member LM and the liquid crystal display panel DP. The optical member OM may convert light emitted from the light source member LM and transmit the converted light to the liquid crystal display panel DP. The optical member OM may include a color conversion layer CCL.

The display device DD may include a bottom cover BC. The bottom cover BC disposed on the lower side of the light source member LM may be for housing the light source member LM, the optical member OM, and the liquid crystal display panel DP. The bottom cover BC may include a bottom part BC-B and sidewall parts BC-S bent and extending from the bottom part BC-B. The bottom cover BC may be made of metal or plastic.

On the other hand, a housing HAU may be disposed on the upper side of the liquid crystal display panel DP. In the display device DD of this exemplary embodiment, the bottom cover BC and the housing HAU are coupled to each other to accommodate the liquid crystal display panel DP, the optical member OM, and the light source member LM. The housing HAU may be made of metal or plastic.

The housing HAU may be disposed on the upper side of the liquid crystal display panel DP to cover the edge area of the liquid crystal display panel DP. The housing HAU may include an opening part HAU-OP where an image is provided. The housing HAU may be a rectangular frame in a plane. The housing HAU may include a housing sidewall part HAU-S and a front part HAU-T bent from the housing sidewall part HAU-S. The front part HAU-T may be omitted in other exemplary embodiments.

A mold member (not shown) may further be provided between the bottom cover BC and the housing HAU. The mold member (not shown) may support the liquid crystal display panel DP and the like so that the liquid crystal display panel DP is spaced apart from the light source member LM at a predetermined interval.

In the display device DD of an exemplary embodiment as shown in FIG. 5, the liquid crystal display panel DP includes a first substrate SUB1, a second substrate SUB2 facing the first substrate SUB1, and a liquid crystal layer LCL disposed between the first substrate SUB1 and the second substrate SUB2. The liquid crystal display panel DP may be divided into a display area and a border area surrounding the display area. The display area is an area where an image is displayed on a plane, and the border area is an area that is adjacent to the display area on a plane, and where no image is displayed. The liquid crystal display panel DP may include a plurality of pixels disposed in the display area.

Signal lines and a pixel circuit of pixels are formed on any one (hereinafter, an array substrate) of the first substrate SUB1 and the second substrate SUB2. The array substrate may be connected to the main circuit substrate through a chip-on-film (COF) or the like. A central control circuit for driving the liquid crystal display panel DP may be disposed on the main circuit board. The central control circuit may be a microprocessor. The chip of the COF may be a data driving circuit. The gate drive circuit may be mounted on the array substrate or may be integrated on the array substrate in the form of low temperature poly-silicon (LTPS).

The central control circuit may control the light emitting units LU. The control signal for controlling the light emitting units LU may be transmitted to the dimming circuit of the light emitting units LU.

The light source member LM may be disposed on the lower side of the liquid crystal display panel DP. The light source member LM may be provided on the bottom part BC-B of the bottom cover BC. The light source member LM may include a plurality of light emitting units LU and a reflection plate RF. The plurality of light emitting units LU may be disposed on the upper part of the reflection plate RF. The light emitting units LU are disposed on the lower side of the liquid crystal display panel DP and the optical member OM.

Each of the light emitting units LU may include a plurality of light emitting elements LD forming a point light source and a circuit board FB providing an electrical signal to the light emitting element LD. Each of the plurality of light emitting elements LD may include a light emitting diode LED. The light emitting units LU may include different numbers of light emitting elements LD.

On the other hand, although FIGS. 1 and 2 show that the light emitting elements LD are spaced and disposed at regular intervals, the inventive concept is not limited thereto. The arrangement interval of the light emitting elements LD may vary depending on a position corresponding to the central area or the edge area of the liquid crystal display panel DP, and the like. In the different light emitting units LU, the arrangement interval of the light emitting elements LD may be different.

The light emitting element LD may be one that receives an electrical signal from a circuit board FB to emit light. Although not shown separately, the display device DD may further include a connection circuit board (not shown) electrically connecting the light emitting units LU to each other. A dimming circuit may be disposed on the connection circuit board (not shown). This dimming circuit may dim the light emitting units LU based on the control signal received from the central control circuit. In an exemplary embodiment, the light emitting elements LD may be turned on and off independently of each other. That is, the plurality of light emitting elements LD included in one light emitting unit LU may be independently turned on and off. For example, one light emitting unit LU may include a turn-on light emitting element, and also a turn-off light emitting element disposed adjacent to the turn-on light emitting element. Further, the plurality of light emitting elements LD included in one light emitting unit LU may be dimmed independently of each other. As shown in FIG. 3, the light emitting elements LD are connected to the respective signal lines LU-S so as to be dimmable. As shown in FIGS. 2 and 3, the circuit boards FB may have a shape extending in the first directional axis DR1.

FIG. 4 is a cross-sectional view showing an exemplary embodiment of the light emitting unit LU. Referring to FIG. 4, a light emitting element LD included in the light emitting unit LU may include a light emitting diode LED, a pair of lead frames LF1 and LF2, and a body part BD.

The light emitting diode LED generates light in response to a voltage supplied from the circuit board FB. The light emitting diode LED has a structure in which an n-type semiconductor layer, an active layer, and a p-type semiconductor layer are sequentially stacked, and when a driving voltage is applied, electrons and holes may be recombined while moving and light may be generated.

The body part BD may mount a light emitting diode LED and fix the first lead frame LF1 and the second lead frame LF2. The body part BD may be made of a material, such as a polymer resin. In addition, the body part BD may have a cavity CV, and the cavity CV may be a space in which the light emitting diode LED is mounted.

The light emitting diode LED may be disposed in the cavity CV of the body part BD and a sealing part SR that surrounds and fills the light emitting diode LED may be disposed in the cavity CV. The sealing part SR may serve to protect the light emitting diode LED. The sealing part SR may be filled with a filling resin including epoxy resin or acrylic resin.

In addition, each of the first lead frame LF1 and the second lead frame LF2 may penetrate a part of the body part BD. In addition, the lead frames LF1 and LF2 exposed in the cavity CV and the light emitting diode LED may be electrically connected by the connection wires WL1 and WL2.

In an exemplary embodiment, the light emitting element LD may be one emitting a first color light. That is, the light emitting units LU may emit the first color light. The first color light may have a center wavelength in a wavelength range of 420 nm to 470 nm, inclusive. The first color light may be a typical blue light.

On the other hand, the shape of the light emitting unit LU is not limited to that shown in FIG. 4, and for example, the sealing part SR and the like may be disposed to surround the light emitting diode LED in a lens shape. In this case, the light emitting element LD may not include a separate body part BD.

The first color light provided from the light emitting unit LU may be provided to the liquid crystal display panel DP as white light through a color conversion layer CCL to be described later. In other words, by combining the light emitting element LD of the light source member LM and the quantum dots QD (see FIG. 6) contained in the color conversion layer CCL, the light provided from the light source member LM may be finally provided to the liquid crystal display panel DP as white light.

Referring again to FIG. 1, the light source member LM may further include a reflection plate RF. The reflection plate RF may be disposed on the bottom part BC-B of the bottom cover BC and cover the entire bottom part BC-B. However, the inventive concept is not limited thereto, and the reflection plate RF may not overlap the light emitting unit LU, as shown in the drawings. For example, the reflection plate RF may be disposed on the bottom part BC-B of the bottom cover BC between the light emitting units LU.

The reflection plate RF may include a reflective film or a reflective coating layer. The reflection plate RF may reflect the light provided toward the bottom part BC-B of the bottom cover BC and allow it to enter the inside of the optical member OM again.

Referring to FIG. 5, the optical member OM in the display device DD may include a base substrate BS, a color conversion layer CCL disposed on the base substrate BS, a filter layer FL disposed between the base substrate BS and the color conversion layer CCL, and an optical path changing layer. In the display device DD of this exemplary embodiment, the optical path changing layer may be a low refraction layer LRL or a pattern layer OPL (see FIG. 14).

The optical member OM may function to transmit or wavelength-convert the light provided by the light emitting unit LU of the light source member LM and transmit it to the liquid crystal display panel DP. Also, in order to effectively transmit the light provided from the light emitting unit LU to the liquid crystal display panel DP, the optical member OM may include a plurality of optical functional layers.

The optical member OM is disposed on the light source member LM and the lower surface BS-B of the base substrate BS which is the lower side surface of the optical member OM is spaced apart from the light emitting unit LU at a predetermined interval. Light provided from the light-emitting unit LU may be incident on the lower surface BS-B of the base substrate BS.

The base substrate BS of the optical member OM may be made of glass. However, the inventive concept is not limited thereto. The base substrate BS may be made of a polymer resin and, for example, may be formed including an acrylic resin or the like. The base substrate BS may serve as a base where a color conversion layer CCL, a filter layer FL, a low refraction layer LRL, a pattern layer OPL (see FIG. 14), or a scattering layer SL (see FIG. 11A), which are optical functional layers described later, is disposed.

Figure 6:
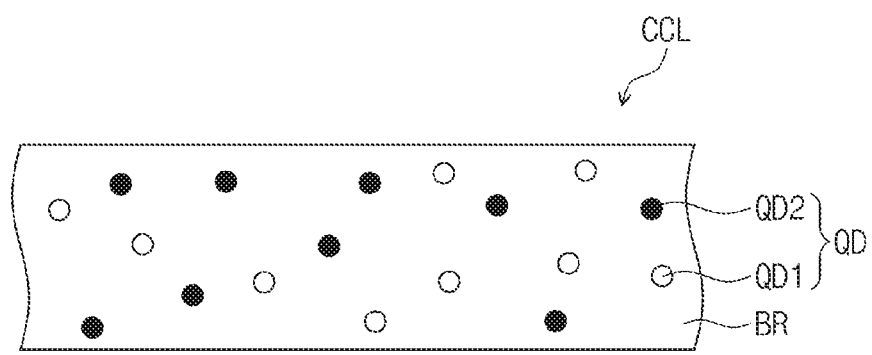
FIG. 6 is a cross-sectional view showing a color conversion layer according to an exemplary embodiment of the inventive concept.

In an exemplary embodiment, the color conversion layer CCL may be disposed on the upper side of the base substrate BS. FIG. 6 is a cross-sectional view showing a color conversion layer CCL in an exemplary embodiment. The color conversion layer CCL may include a base resin BR and a quantum dot QD. The quantum dot QD may be dispersed in the base resin BR.

The base resin BR is a medium in which a quantum dot QD is dispersed and may be made of various resin compositions which may be generally referred to as a binder. However, the inventive concept is not limited thereto, and a medium capable of dispersing a quantum dot QD in this specification may be referred to as a base resin BR regardless of its name, additional other functions, constituent materials, and the like. The base resin BR may be a polymer resin. For example, the base resin BR may be an acrylic resin, a urethane resin, a silicone resin, an epoxy resin, or the like. The base resin BR may be a transparent resin.

The quantum dot QD may be a particle that changes the wavelength of the light provided from the light emitting unit LU (see FIG. 5). The quantum dot QD is a material with a crystal structure of a few nanometers in size and consists of hundreds to thousands of atoms, and shows a quantum confinement effect in which an energy band gap is increased due to a small size. When a light of a wavelength with energy higher than a band gap is incident on the quantum dot QD, the quantum dot QD absorbs the light and becomes excited and drops to the ground state while emitting a light of a specific wavelength. The light of the emitted wavelength has a value corresponding to the band gap. The quantum dot QD may adjust the light emission characteristics of the quantum confinement effect when adjusting its size and composition. The quantum dot QD may be selected from Group II-VI compounds, Group III-V compounds, Group IV-VI compounds, Group IV elements, Group IV compounds, and combinations thereof.

The Group II-VI compound may be selected from bivalent element compounds selected from the group consisting of CdSe, CdTe, ZnS, ZnSe, ZnTe, ZnO, HgS, HgSe, HgTe, MgSe, MgS, and compounds thereof, trivalent element compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and compounds thereof, and tetravalent element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and compounds thereof.

The Group III-V compound may be selected from bivalent element compounds selected from the group consisting of GaN, GaP, GaAs, GaSb, AlN, AlP, AlAs, AlSb, InN, InP, InAs, InSb, and compounds thereof, trivalent element compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and compounds thereof, and tetravalent element compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and compounds thereof.

The Group IV-VI compound may be selected from bivalent element compounds selected from the group consisting of SnS, SnSe, SnTe, PbS, PbSe, PbTe, and compounds thereof, trivalent element compounds selected from the group consisting of SnSeS, SnSeTe, SnSTe, PbSeS, PbSeTe, PbSTe, SnPbS, SnPbSe, SnPbTe, and compounds thereof, and tetravalent element compounds selected from the group consisting of SnPbSSe, SnPbSeTe, SnPbSTe, and compounds thereof. The Group IV elements may be selected from the group consisting of Si, Ge, and compounds thereof. The IV group compound may be a bivalent element compound selected from the group consisting of SiC, SiGe, and compounds thereof.

At this time, the bivalent element compound, the trivalent element compound, or the tetravalent element compound may be present in the particle at a uniform concentration, or may be present in the same particle by dividing the concentration distribution into a partially different state.

The quantum dot QD may have a core shell structure including a core and a shell surrounding the core. Also, one quantum dot may have a core/shell structure surrounding other quantum dots. The interface between the core and the shell may have a concentration gradient that is lowered as the concentration of the element in the shell approaches the center.

The quantum dot QD may be a particle having a nanometer scale size. The quantum dot QD may have a full width of half maximum (FWHM) of the emission wavelength spectrum of about 45 nm or less, preferably about 40 nm or less, more preferably about 30 nm or less, and in this range, color purity and color reproducibility may be improved. Further, since light emitted through the quantum dot QD is emitted in all directions, a wide viewing angle may be improved.

The shape of the quantum dot QD is not particularly limited as long as it is a form commonly used in the art, and more specifically, it may be in the form of spherical, pyramidal, multi-arm or cubic nanoparticles, nanotubes, nanowires, nanofibers, nano platelike particles, and the like.

In an exemplary embodiment, the color conversion layer CCL may include a plurality of quantum dots QD that convert incident light into colors in different wavelength ranges. Referring to FIG. 6, the color conversion layer CCL includes, for example, a first quantum dot QD1 for converting incident light of a specific wavelength into a first wavelength and emitting it and a second quantum dot QD2 for converting the incident light of the specific wavelength into a second wavelength and emitting it. The first quantum dot QD1 converts the first color light provided by the light emitting unit LU (see FIG. 5) into a second color light, and the second quantum dot QD2 converts the first color light provided by the light emitting unit LU (see FIG. 5) into a third color light.

For example, when the light provided from the light emitting unit LU (see FIG. 5) is light in the blue light wavelength range, the first quantum dot QD1 may convert blue light into light of a green light wavelength and the second quantum dot QD2 may convert blue light into light of a red light wavelength. Specifically, when the light provided from the light emitting unit LU (FIG. 5) is blue light having the maximum emission peak (or central wavelength) at 420 nm to 470 nm, the first quantum dot QD1 emits green light having a maximum emission peak (or center wavelength) at 520 nm to 570 nm, and the second quantum dot QD2 may emit red light having a maximum emission peak (or center wavelength) at 620 nm to 670 nm. However, the blue light, the green light, and the red light are not limited to the examples of the wavelength ranges shown above, and it should be understood that the inventive concept includes all wavelength ranges that may be recognized as blue light, green light, and red light.

In relation to the quantum dot QD, depending on the particle size, the color of the emitted light may change, and the particle sizes of the first quantum dot QD1 and the second quantum dot QD2 may be different from each other. For example, the particle size of the first quantum dot QD1 may be smaller than the particle size of the second quantum dot QD2. At this time, the first quantum dot QD1 may emit light having a shorter wavelength than the second quantum dot QD2.

Referring again to FIG. 5, a color conversion layer CCL may be formed by coating on a base substrate BS. The color conversion layer CCL may be provided on the base substrate BS using various methods such as slit coating, spin coating, roll coating, spray coating, and inkjet printing. The color conversion layer CCL may be coated on a filter layer FL described layer or a low refraction layer LRL that is an optical path changing layer or a pattern layer OPL, and may be formed.

Barrier layers BL1 and BL2 may be disposed on the color conversion layer CCL. The barrier layers BL1 and BL2 may be disposed on at least one of the upper surface and the lower surface of the color conversion layer CCL. Further, unlike those shown in the drawings, the barrier layers BL1 and BL2 may be omitted. The barrier layers BL1 and BL2 may be provided on only one of the upper surface and the lower surface of the color conversion layer CCL. For example, if the inorganic layer is disposed on the upper or lower surface of the color conversion layer CCL, the barrier layers BL1 and BL2 may be omitted.

Although FIG. 5 shows that the barrier layers BL1 and BL2 are disposed on the upper and lower surfaces of the color conversion layer CCL, the barrier layers BL1 and BL2 may also be disposed on the side surface of the color conversion layer CCL. For example, the barrier layers BL1 and BL2 may cover the color conversion layer CCL.

The barrier layers BL1 and BL2 serve to prevent penetration of moisture and/or oxygen. The barrier layers BL1 and BL2 may include at least one inorganic layer. That is, the barrier layers BL1 and BL2 may include an inorganic material. For example, the barrier layers BL1 and BL2 may include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride or a metal thin film or the like having secured light transmittance. On the other hand, the barrier layers BL1 and BL2 may further include an organic film. The barrier layers BL1 and BL2 may be composed of a single layer or a plurality of layers.

In an exemplary embodiment, the optical member OM includes a filter layer FL. The filter layer FL may be provided on the lower side of the color conversion layer CCL. For example, the filter layer FL may be disposed directly on the base substrate BS. The filter layer FL may be coated on the upper surface BS-T of the base substrate BS and provided, or may be deposited and provided.

The filter layer FL may transmit the first color light and reflect the second color light and the third color light in the wavelength range different from that of the first color light. That is, the filter layer FL may be a selective transmissive reflective layer. For example, the filter layer FL may transmit blue light and reflect red light and green light.

The filter layer FL may mostly transmit light having a center wavelength in a range of 420 nm to 470 nm, inclusive, and mostly reflect light having a center wavelength in a range of 520 nm and 670 nm, inclusive. For example, the filter layer FL may transmit 80% or more of light having a center wavelength in a range of 420 nm to 470 nm, inclusive, and 80% or more of light having a center wavelength in a range of 520 nm to 670 nm, inclusive.

The filter layer FL reflects part of the incident light and provides it to the liquid crystal display panel DP, so that the efficiency of light provided from the light emitting unit LU to the liquid crystal display panel DP may be increased. In addition, the filter layer FL may block part of the light scattered in the color conversion layer CCL and provided to the lower side of the optical member OM. Accordingly, part of the light scattered in the color conversion layer CCL of the optical member OM and diffused in the direction of the light source member LM is blocked by the filter layer FL, so that the display quality of the display device DD may be improved. The filter layer FL may be a single layer or a stack of a plurality of insulating films. For example, the filter layer FL is formed including a plurality of insulating films, and the transmission and reflection wavelength ranges may be determined depending on the refractive index difference between the stacked layers, the thickness of each of the stacked layers, and the number of stacked layers.

Figure 7A:
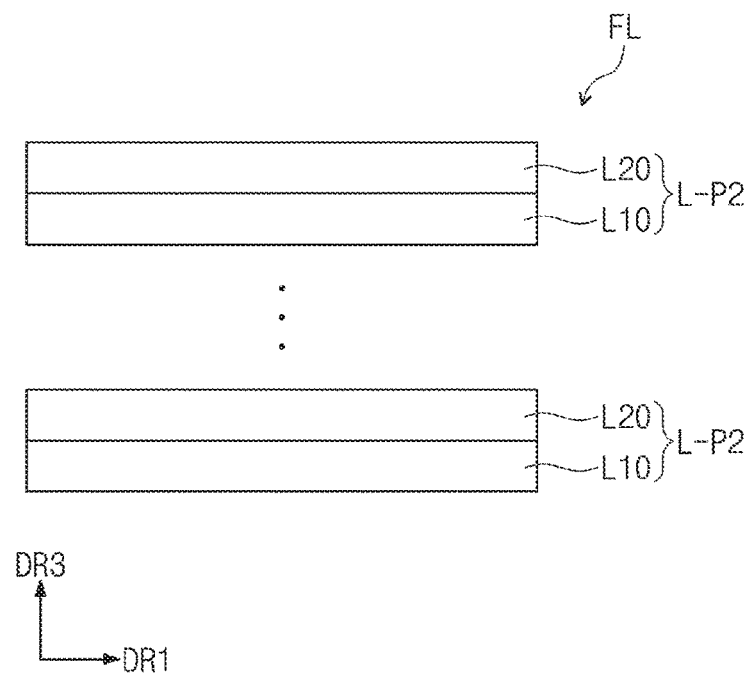
FIG. 7A is a cross-sectional view of a filter layer according to an exemplary embodiment of the inventive concept.

Referring to FIG. 7A, in an exemplary embodiment, the filter layer FL may include a first insulating layer L10 and a second insulating layer L20 having different refractive indices. The filter layer FL may include at least one first insulating film L10 and at least one second insulating film L20. The refractive index of the first insulating film L10 may be 1.4 to 1.6 and the refractive index of the second insulating film L20 may be 1.9 to 2.1.

For example, a metal oxide material may be used for the second insulating layer L20 having a relatively high refractive index. Specifically, the second insulating layer L20 having a high refractive index may include at least one of $TiO_x$, $TaO_x$, $HfO_x$, and $ZrOx$. In addition, the first insulating layer L10 having a relatively low refractive index may include $SiO_x$, $SiCO_x$, or the like. Also, in an embodiment, the filter layer FL may be formed by alternately repeating deposition of SiNx and SiOx.

The continuously stacked first insulating film L10 and the second insulating film L20 may be defined as a unit layer L-P2. The filter layer FL may include a plurality of unit layers L-P2. For example, the filter layer FL may include unit layers L-P2 of 5 or more and 15 or less. However, the inventive concept is not limited thereto, and the configuration of the filter layer FL may vary depending on the color quality implemented in the display device DD.

Figure 7B:
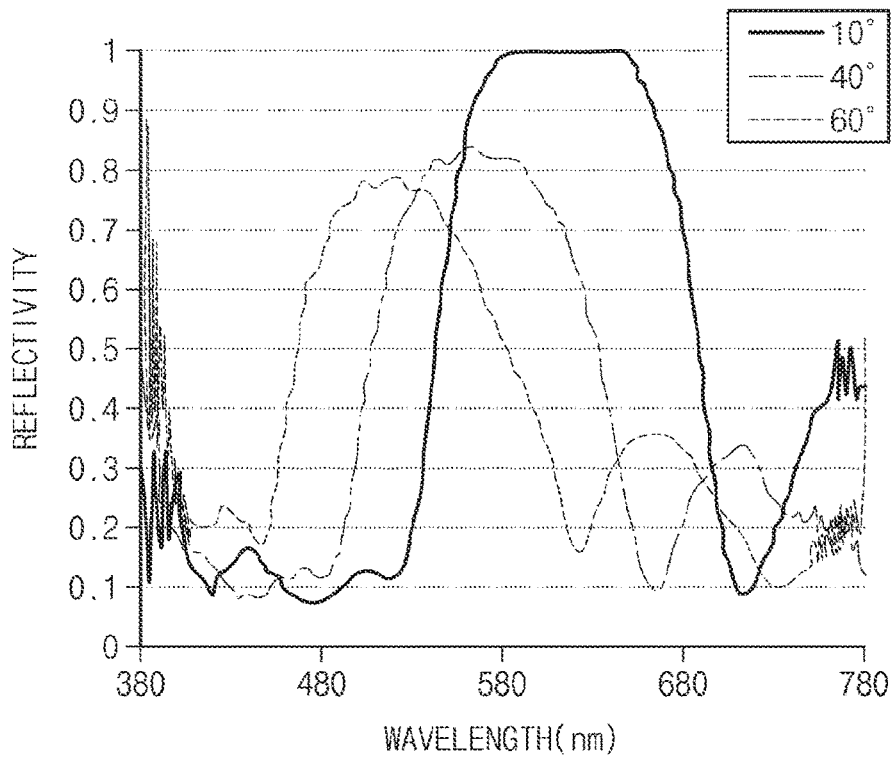
FIG. 7B is a graph showing the optical characteristics of a filter layer according to an exemplary embodiment of the inventive concept.

Further, the thicknesses of the first insulating films L10 included in the unit layers L-P2 may be different from each other, and the thicknesses of the second insulating films L20 included in the unit layers L-P2 may be different from each other. FIG. 7B is a graph showing the optical characteristics of the filter layer FL according to an exemplary embodiment. The graph shown in FIG. 7B shows the reflectance of each wavelength according to the incident angle of the light incident on the filter layer FL. The sample used in the evaluation shown in FIG. 7B was fabricated to have a laminated structure of a base substrate BS/a filter layer FL/a color conversion layer CCL. The used light emitting unit LU emits blue light, and the color conversion layer CCL includes quantum dots QD1 and QD2 that are excited by blue light and emit red and green light. On the other hand, the filter layer FL used $SiO_x$ as the first insulating film L10 and used SiNx as the second insulating film L20, and used 13 unit layers L-P2.

Referring to FIG. 7B, it may be seen that the central wavelength range of the light reflected by the filter layer FL changes according to the incident angle of the light incident on the filter layer FL. Referring to FIG. 7B, it may be seen that as the incident angle of light incident on the filter layer FL increases, the center wavelength of the light reflected by the filter layer FL changes to a short wavelength. Referring to FIG. 7B, it may be seen that when the incident angle of the light incident on the filter layer FL is 10°, most of the light is reflected in the area of 500 nm to 700 nm. As compared to this, it may be seen that as the incident angle increases gradually to 40° and 60°, the wavelength of the light reflected from the filter layer FL moves to the short wavelength range so that the center wavelength of the reflected light moves less than 500 nm. Also, it may be seen that as the incident angle gradually increases to 40° and 60°, the reflectivity of the light reflected from the filter layer FL is reduced compared with the case where the incident angle is 10°.

Referring to FIG. 7B, when the incident angle of the light incident on the filter layer FL is a low angle, the filter layer FL transmits most of the light in the area of 500 nm to 700 nm to transmit the blue light and effectively reflect the red light and the green light. But, it may be seen that as the incident angle of the light incident on the filter layer FL becomes larger, the wavelength range of the reflected light moves to the short wavelength range so that the light of part of a wavelength range among the light corresponding to the red light and the green light may not be effectively reflected, and the reflectivity is also reduced.

That is, the optical member OM includes the filter layer FL to reflect the red light and the green light in the light scattered by the color conversion layer CCL and directed to the lower part of the optical member OM, thereby increasing the light efficiency and improving the color quality. However, as the incident angle of the light incident on the filter layer FL increases to become a high angle, the function of reflecting the entire green light and red light areas may be degraded.

Accordingly, referring to FIG. 5, the optical member OM of an exemplary embodiment may include an optical path changing layer provided on at least one of an upper surface and a lower surface of the filter layer FL. The optical path changing layer may change the path of light provided to the filter layer FL or change the path of light emitted from the filter layer FL. The optical path changing layer may be a low refraction layer LRL or a pattern layer OPL (see FIG. 14). For example, the optical path changing layer may optimize the selective transmission reflection function of the filter layer FL by reducing the incident angle of the light provided to the filter layer FL to be low angle.

In an exemplary embodiment, the optical path changing layer may be a low refraction layer LRL having a lower refractive index than the color conversion layer CCL. As the low refraction layer LRL has a lower refractive index than the color conversion layer CCL, by refracting or reflecting light provided from the color conversion layer CCL to the low refraction layer LRL, it is possible to change the path of light provided to the low refraction layer LRL.

The refractive index of the low refraction layer LRL may be less than 1.4. For example, the refractive index of the low refraction layer LRL may be between 0.1 or more and 1.4 or less. The low refraction layer LRL may be provided directly on the upper or lower surface of the filter layer FL.

The low refraction layer LRL may be a layer including at least one low refractive index material, or formed of the material itself having a low refractive property. When the low refraction layer LRL includes at least one low refractive index material, the low refractive index material may be a void, a hollow inorganic particle, a porous silica particle, or a siloxane polymer having a cage structure.

Figure 8:
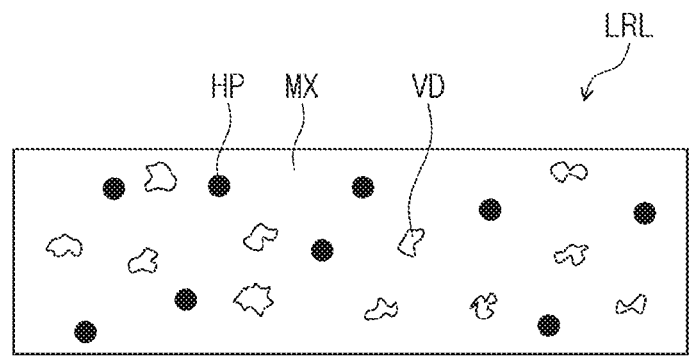
FIG. 8 is a cross-sectional view showing a low refraction layer according to an exemplary embodiment of the inventive concept.

FIG. 8 is a cross-sectional view showing a low refraction layer LRL according to an exemplary embodiment. Referring to FIG. 8, the low refraction layer LRL may include a matrix part MX, hollow inorganic particles HP, and voids VD. The low refraction layer LRL may include a plurality of hollow inorganic particles HP and a plurality of voids VD. The plurality of hollow inorganic particles HP may be dispersed and disposed in the matrix part MX and the plurality of voids VD may be defined by the matrix part MX. The void VD corresponds to a portion not filled with the matrix part MX.

Unlike what is shown in FIG. 8, a low refraction layer LRL according to an exemplary embodiment may include at least one of the hollow inorganic particles HP and the voids VD. For example, the low refraction layer LRL may include hollow inorganic particles HP and a matrix part MX, or the low refraction layer LRL may include a matrix part MX and a void VD defined by the matrix part MX.

The low refraction layer LRL according to an exemplary embodiment may include a siloxane polymer, and the siloxane polymer may include a fluorinated siloxane unit or may have a cage compound structure such as silsesquioxane.

The matrix part MX may include a polymeric material. The matrix part MX may include at least one of an acrylic polymer, a silicone polymer, a urethane polymer, and an imide polymer. For example, the matrix part MX may include any one polymer material selected from an acrylic polymer, a silicone polymer, a urethane polymer, and an imide polymer, or a combination of a plurality of selected polymer materials.

The matrix part MX may be formed of an acrylic resin, a silicone resin, a urethane resin, or an imide resin. The matrix part MX may be formed by providing a polymer resin and subsequently solidifying the polymer resin in a high-temperature process or an ultraviolet treatment process.

The hollow inorganic particles HP may be in the form of a core shell. In an embodiment, the hollow inorganic particles HP may be spherical. Each of the hollow inorganic particles HP may include a core part and a shell part surrounding the core part. The core part may be defined by a shell part. The shell part may be a layer formed of an inorganic material. The shell part may include at least one of $SiO_2$, $MgF_2$, and $Fe_3O_4$. For example, a hollow inorganic particle HP in a low refraction layer LRL according may be hollow silica.

The core part may be filled with air. On the other hand, the inventive concept is not limited thereto, and in the hollow inorganic particle HP, the core part may be filled with a liquid or gas having low refractive property.

The voids VD included in the low refraction layer LRL of an exemplary embodiment may be a portion defined by a matrix part MX. The void VD may not be filled with the matrix part MX, and the void VD may have the empty inside. For example, the void VD may be an empty space defined by the matrix part MX. On the other hand, the void VD may be a portion filled with air, and the air filled void VD may be a portion that reduces the refractive index value of the low refraction layer LRL.

Although the void VD is shown to have a random shape in the low refraction layer LRL according to the exemplary embodiment shown in FIG. 8, the inventive concept is not limited thereto. In another exemplary embodiment, the void VD may be a space having a spherical form.

In a low refraction layer LRL of an exemplary embodiment, the voids VD may be formed by pore-inducing materials (e.g., porogen). The pore-inducing material may be a linear type or a dendrimer type organic material. The pore-inducing material may be provided with the polymeric resin forming the matrix part MX and then removed to form voids VD.

The linear pore-inducing material may be a single molecule of hydrocarbon which may be represented by

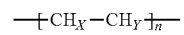

(x, y, and n are each independently an integer of 1 or more), or branched poly(p-xylene), linear poly(p-phenylene), linear polybutadiene, branched polyethylene, polycarbonates, polyamideimide, polyphthalamide, or polymethylstyrene.

In addition, the dendrimer-type pore-inducing material may include a core portion and a branch portion coupled to the core portion and connected in a regular branch structure to have a form diffused to the outer part. In the dendrimer type pore-inducing material, cyclosiloxane, cyclodextrin, bezene, etc. may be applied to the core portion. In addition, a hydrocarbon group that may be represented by

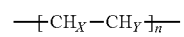

may be applied to the branch portion in the dendrimer type pore-inducing material.

In an exemplary embodiment, the low refraction layer LRL may be a metal layer. The low refraction layer LRL may be a metal layer of a single layer. The low refraction layer LRL may be a layer formed of a metal material, such as Ag, Al, Cu, or Au. Alternatively, the low refraction layer LRL may be a layer formed of an alloy of a metal material such as Ag, Al, Cu, or Au. For example, the low refraction layer LRL may be a layer made of only a metal material such as Ag, Al, Cu, or Au, or a layer formed of an alloy of Cu—Zn.

The low refraction layer LRL may be a metal layer having a thickness of 30 Å or more to 100 Å or less. When the thickness of the metal layer is less than 30 Å, the metal materials constituting the metal layer may condense each other to provide a low refraction layer LRL having a uniform thickness. In addition, in the case where the thickness of the metal layer is more than 100 Å, when the transmittance of the metal layer is less than 90% and is included in the optical member OM, the light efficiency of the display device DD may be lowered.

Figure 9:
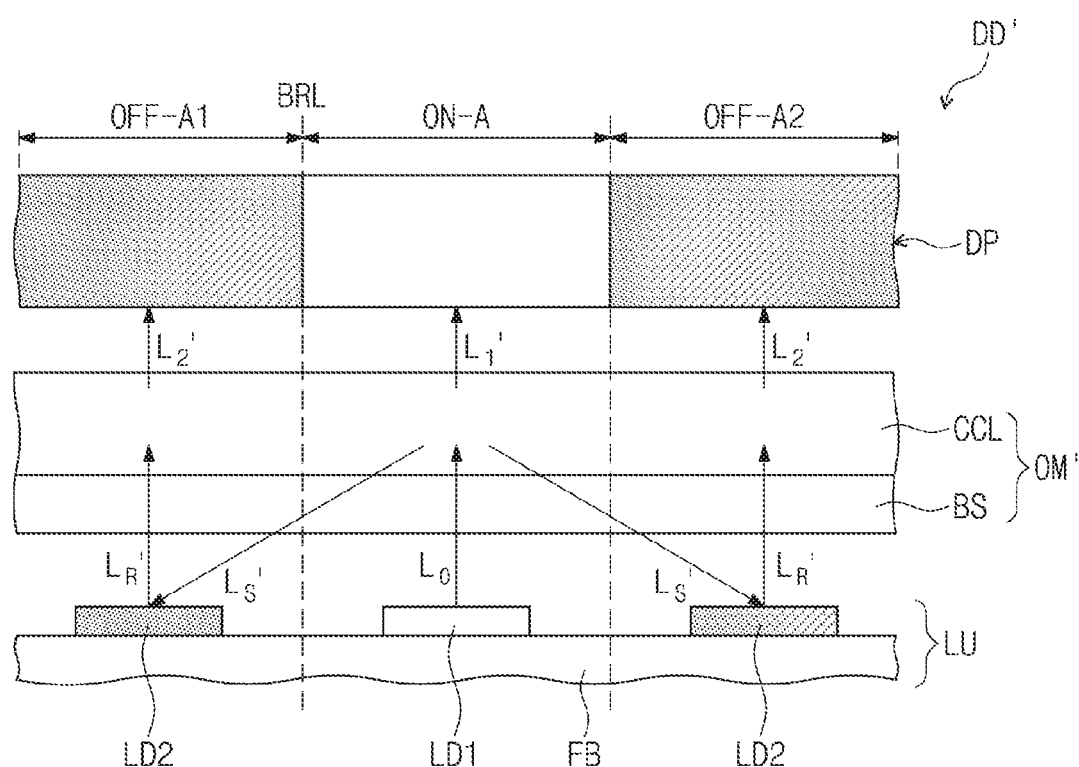
FIG. 9 is a cross-sectional view schematically showing an optical path in a conventional display device.
Figure 10:
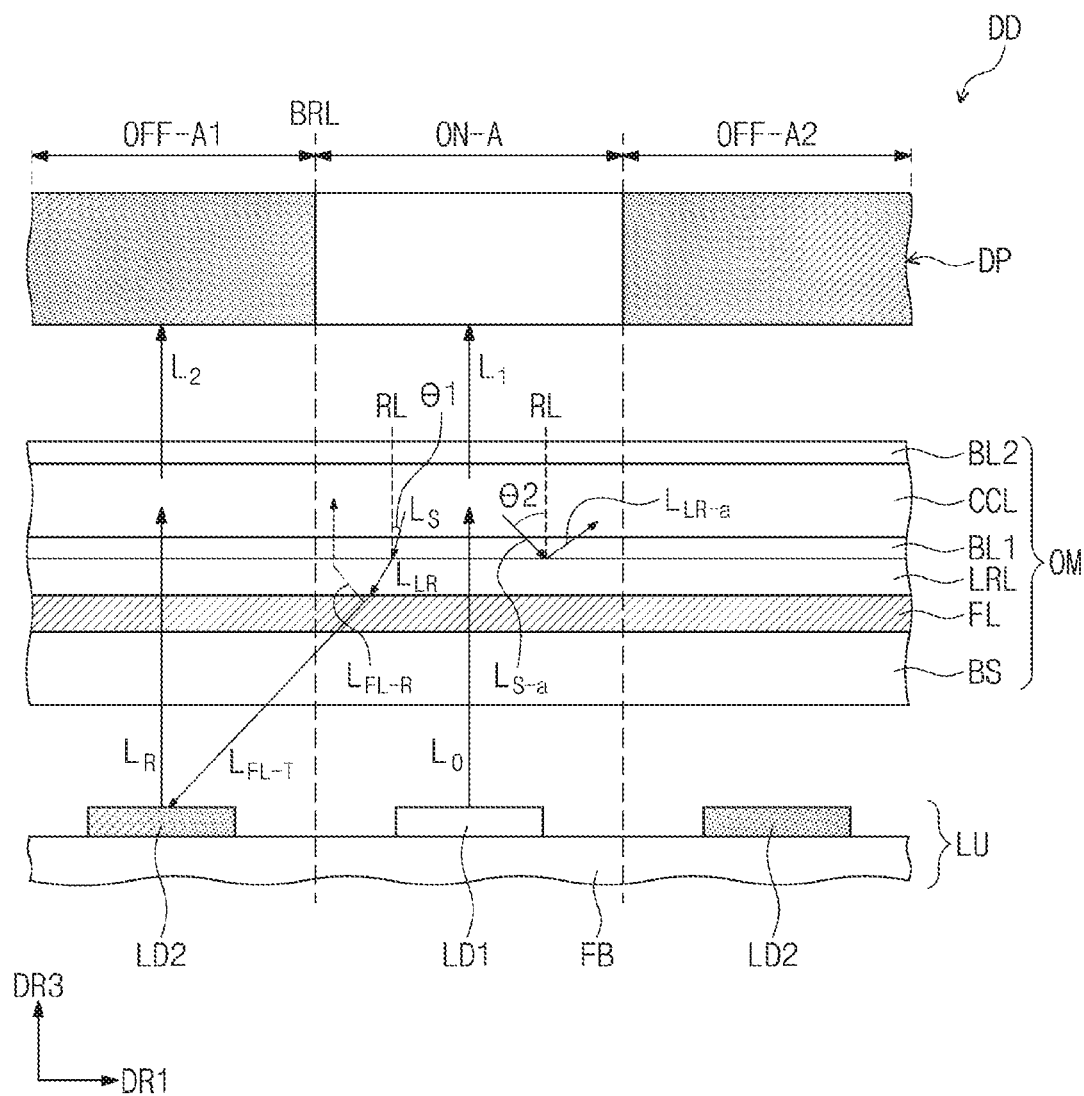
FIG. 10 is a cross-sectional view schematically showing an optical path in a display device according to an exemplary embodiment of the inventive concept.

FIG. 9 is a view exemplarily showing an optical path in a conventional display device DD', and FIG. 10 is a view exemplarily showing an optical path in a display device DD of an exemplary embodiment. In FIGS. 9 and 10, the first display area ON-A corresponds to the area of the liquid crystal display panel DP corresponding to the turn-on light emitting element LD1 in the light emitting unit LU, and the second display area OFF-A1 and the third display area OFF-A2 correspond to the area of the liquid crystal display panel DP corresponding to the turn-off light emitting element LD2 in the light emitting unit LU. A first display area ON-A corresponding to the turn-on light emitting element LD1 displays a color image, and a second display area OFF-A1 and a third display area OFF-A2 corresponding to the turn-off light emitting element LD2 may display a black image.

Unlike the display device DD of the inventive concept, the conventional display device DD' shown in FIG. 9 does not include a filter layer and an optical path changing layer in the optical member OM'.

In the operation of the conventional display device DD', the light $L_0$ emitted from the turn-on light emitting element LD1 among the light emitting elements included in the light emitting unit LU passes through the color conversion layer CCL and is provided as the first light $L_1'$ to the liquid crystal display panel DP. The first light $L_1'$ includes the light $L_0$ emitted from the light emitting element LD1 and the light obtained when the light $L_0$ provided from the light emitting element LD1 is converted in the color conversion layer CCL and provided. The first light $L_1'$ may include all of blue light, green light, and red light. That is, the first light $L_1'$ may be white light including all of blue light, green light, and red light.

On the other hand, the light $L_{S'}$ scattered in the color conversion layer CCL may be incident on a second display area OFF-A1 or a third display area OFF-A2 where the turn-off light emitting element LD2 is disposed. In addition, a part of the light $L_{S'}$ incident on the second display area OFF-A1 or the third display area OFF-A2 may be reflected and again incident on the color conversion layer CCL as the reflected light $L_{R''}$.

Like the first light $L_1'$, the light $L_{S'}$ that is the scattering light may include all of blue light, green light and red light. Like the scattering light $L_{S'}$, the light $L_{R'}$, that is, the reflected light, may also include all of blue light, green light, and red light.

In the reflected light $L_{R'}$ incident on the color conversion layer CCL, the blue light may again excite the quantum dots contained in the color conversion layer CCL. Accordingly, the second light $L_2'$, which is the light that is transmitted again through the color conversion layer CCL and is provided to the second display area OFF-A1 or the third display area OFF-A2, includes the green light and the red light excited and converted by the blue light included in the reflected light $L_{R'}$ in addition to the blue light, green light, and red light included in the reflected light $L_{R''}$. Therefore, since the second light $L_2'$ emitted from the display areas OFF-A1 and OFF-A2 corresponding to the turn-off light emitting element LD2 is excited by the reflected light $L_{R'}$ and further includes light provided from the color conversion layer CCL, the ratio of the red light and the green light becomes higher than that of the conventional white light, so that the light may be emitted as yellowish light.

That is, the display areas OFF-A1 and OFF-A2 of the portion corresponding to the turned-off light emitting element LD2 should display a black image, but if there are a turn-on light emitting element LD1 and a turn-off light emitting element LD2 adjacent thereto, the yellowish light is emitted in the display areas OFF-A1 and OFF-A2 of the portion corresponding to the turn-off light emitting element LD2. Accordingly, a yellow ring phenomenon may occur near the boundary line BRL of the first display area ON-A corresponding to the turn-on light emitting element LD1 and the display areas OFF-A1 and OFF-A2 of the portion corresponding to the turn-off light emitting element LD2.

FIG. 10 schematically shows the optical path in the case of having the configuration of the display device DD of the exemplary embodiment shown in FIG. 5.

The light $L_0$ emitted from the turn-on light emitting element LD1 among the light emitting elements included in the light emitting unit LU passes through the color conversion layer CCL and is provided as the first light $L_1$, to the liquid crystal display panel DP. The first light $L_1$ includes the light $L_0$ emitted from the light emitting element LD1 and the light obtained when the light $L_0$ provided from the light emitting element LD1 is converted in the color conversion layer CCL and provided. The first light $L_1$ may include all of blue light, green light, and red light. That is, the first light $L_1$ may be provided to the liquid crystal display panel DP as white light including all of blue light, green light, and red light.

On the other hand, the light $L_S$, which is a portion of the light scattered in the color conversion layer CCL, may be incident on the low refraction layer LRL. The light $L_S$, which is a scattering light incident on the low refraction layer LRL, may have an incident angle Θ1 less than the critical angle. That is, the light $L_S$ incident on the low refraction layer LRL at an angle less than the critical angle is refracted and incident on the filter layer FL, and the filter layer FL may transmit some light and reflect some light. In FIG. 10, the incident angle of light incident on the low refraction layer LRL may represent an increased angle based on the imaginary line RL extending in the normal direction with respect to the upper surface of the low refraction layer LRL.

A portion of the light $L_{FL-T}$ transmitted through the filter layer FL may be incident on the second display area OFF-A1 where the turn-off light emitting element LD2 is disposed. The light $L_{FL-T}$ incident on the second display area OFF-A1 may be blue light. On the other hand, a portion of the light $L_{FL-T}$ light transmitted through the filter layer FL may be reflected by the light emitting unit LU and may be incident again on the color conversion layer CCL as a reflected light $L_R$.

In the reflected light $L_R$ incident on the color conversion layer CCL, the blue light may again excite the quantum dots contained in the color conversion layer CCL. Therefore, the second light $L_2$, which is the light that is transmitted again through the color conversion layer CCL and is provided to the second display area OFF-A1 of the liquid crystal display panel DP, may include blue light, green light, and red light, and may be a white light whose color balance is matched. In other words, unlike the light $L_2$ that is the second light described with reference to FIG. 9, in FIG. 10, the light $L_2$, which is the second light emitted to the second display area OFF-A1, is a white light that is not changed to be yellowish, and in the case of the display device DD of this exemplary embodiment, the yellow ring, which is a problem in the conventional display device DD', may be improved to show excellent display detail.

On the other hand, a portion of the scattering light $L_S$ scattered in the color conversion layer CCL and incident on the low refraction layer LRL may be reflected in the filter layer FL. The light $L_{FL-R}$, which is the light reflected from the filter layer FL, may be red light and green light. The reflected light $L_{FL-R}$ may again be incident on the color conversion layer CCL.

In FIG. 10, the light $L_{S-a}$ in the light scattered in the color conversion layer CCL shows a case where an angle Θ2 incident on the low refraction layer LRL is greater than the critical angle. A scattering light $L_{S-a}$ with an incident angle greater than the critical angle may be totally reflected in a low refraction layer LRL. That is, the scattering light $L_{S-a}$ may be entirely reflected on the upper surface of the low refraction layer LRL and then incident on the color conversion layer CCL.

Therefore, the display device DD of this exemplary embodiment includes both the low refraction layer LRL and the filter layer FL in the optical member OM to reflect and block or selectively transmit and reflect the light scattered in the color conversion layer CCL and directed to the light source member so that it is possible to prevent deterioration of color quality in the display areas OFF-A1 and OFF-A2 corresponding to the turn-off light emitting element LD2. Thus, the display device DD of this exemplary embodiment includes a color conversion layer CCL with quantum dots, a filter layer FL disposed on the lower side of the color conversion layer CCL, and a low refraction layer LRL disposed on at least one of an upper surface and a lower surface of the filter layer FL, thereby displaying excellent color reproducibility and improved display quality.

Also, although not shown in the drawing, when a low refraction layer LRL is placed on the upper surface of the filter layer, the low refraction layer LRL is scattered in the color conversion layer CCL and may reduce the incident angle of the light incident on the filter layer FL to be a low angle. Therefore, the filter layer FL may effectively transmit or reflect the incident light, so that the color quality of the display device DD may be improved.

Although the optical path of this exemplary embodiment, in which the low refraction layer LRL is disposed on the upper surface of the filter layer FL, is described with reference to FIG. 10, unlike this, even when the low refraction layer LRL is disposed on the lower surface of the filter layer FL, the display quality of the display device DD of this exemplary embodiment may be improved. For example, if a low refraction layer LRL is provided on the lower surface of the filter layer FL, the traveling direction of light passing through the filter layer FL and directed toward the light-emitting unit LU may be reduced to be a low angle, so that it is possible to reduce the amount of light directed to the display areas OFF-A1 and OFF-A2 corresponding to the turned-off light emitting element LD2.

Figure 11A:
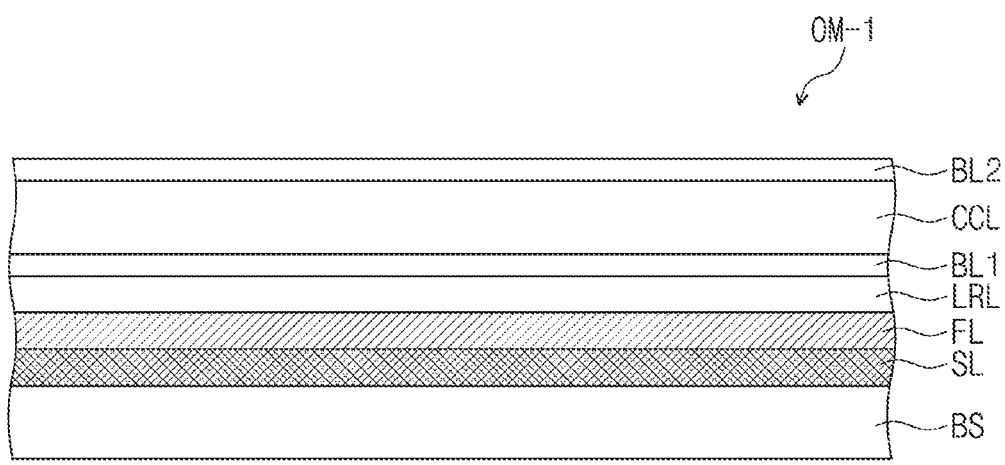
FIG. 11A is a cross-sectional showing an optical member according to an exemplary embodiment of the inventive concept.
Figure 11B:
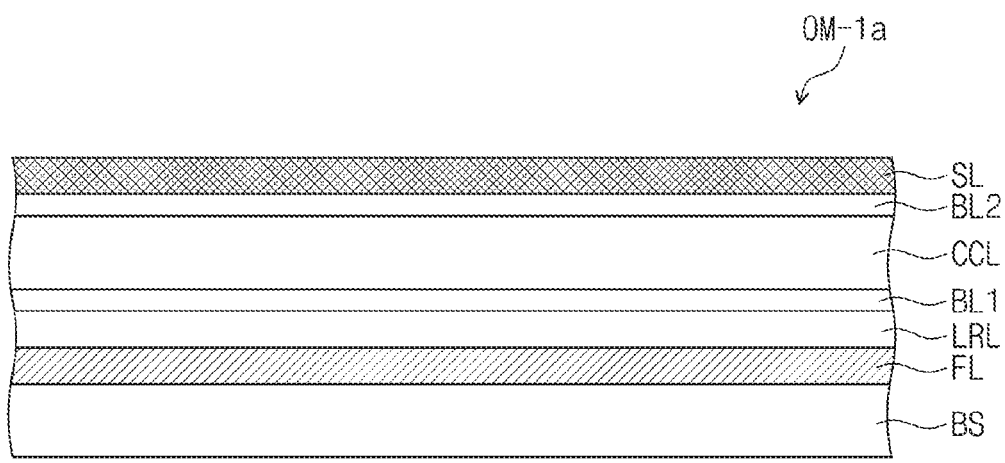
FIG. 11B is a cross-sectional showing an optical member according to an exemplary embodiment of the inventive concept.

FIGS. 11A and 11B are cross-sectional views showing optical members OM-1 and OM-1a according to an exemplary embodiment. Referring to FIGS. 11A and 11B, the optical members OM-1 and OM-1a according to an embodiment may further include a scattering layer SL. The scattering layer SL may be disposed on the upper or lower side of the color conversion layer CCL. On the other hand, in the optical members OM-1 and OM-1a according to an embodiment shown in FIGS. 11A and 11B, for the base substrate BS, the filter layer FL, the low refraction layer LRL, the color conversion layer CCL, and the barrier layers BL1 and BL2, the same contents as those described with reference to FIGS. 1 to 10 may be applied. The scattering layer SL may scatter the light emitted from the light emitting unit LU (see FIG. 5) and pass through the base substrate BS to prevent the hot spot phenomenon. On the other hand, the scattering layer SL may include a base resin and scattering particles mixed (or dispersed) in the base resin. The scattering particles may include inorganic particles. The scattering layer SL may include scattering particles of at least one of $TiO_2$, $SiO_2$, ZnO, $Al_2O_3$, $BaSO_4$, $CaCO_3$ or $ZrO_2$.

In the optical member OM-1 according to the exemplary embodiment shown in FIG. 11A, the scattering layer SL may be disposed on the lower side of the color conversion layer CCL. The scattering layer SL may be disposed between the base substrate BS and the filter layer FL. The scattering layer SL may be disposed directly on the upper surface of the base substrate BS.

Figure 12A:
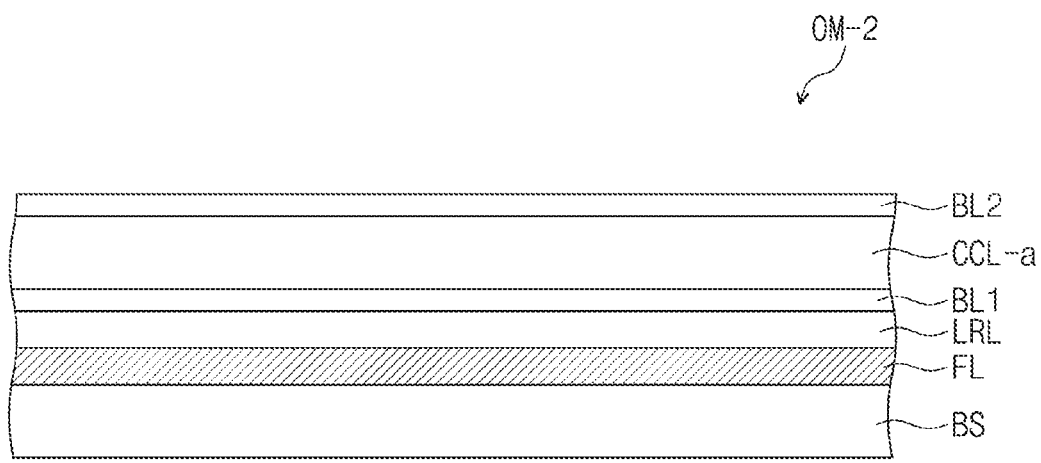
FIG. 12A is a cross-sectional showing an optical member according to an exemplary embodiment of the inventive concept.

In the optical member OM-1a according to the exemplary embodiment shown in FIG. 11B, the scattering layer SL may be disposed on the upper side of the color conversion layer CCL. For example, the scattering layer SL may be the uppermost layer of the optical member OM-1a. On the other hand, in the case of the optical member OM-1a according to the embodiment shown in FIG. 11B, since the scattering layer SL is the uppermost layer and may function as a protective layer to protect the color conversion layer CCL, unlike that shown in the drawings, the barrier layer BL2 disposed on the upper surface of the color conversion layer CCL may be omitted. FIG. 12A is a cross-sectional view showing an optical member OM-2 according to an exemplary embodiment. Compared with the optical members OM-1 and OM-1a shown in FIG. 11A or 11B, the optical member OM-2 shown in FIG. 12A has a structure in which the scattering layer SL is omitted, and the configuration of the color conversion layer CCL-a is partially different from that of the color conversion layer CCL shown in FIG. 11A or 11B. On the other hand, in the optical member OM-2 according to this exemplary embodiment shown in FIG. 12A, for the base substrate BS, the filter layer FL, the low refraction layer LRL, and the barrier layers BL1 and BL2, the same contents as those described with reference to FIGS. 1 to 10 may be applied.

Figure 12B:
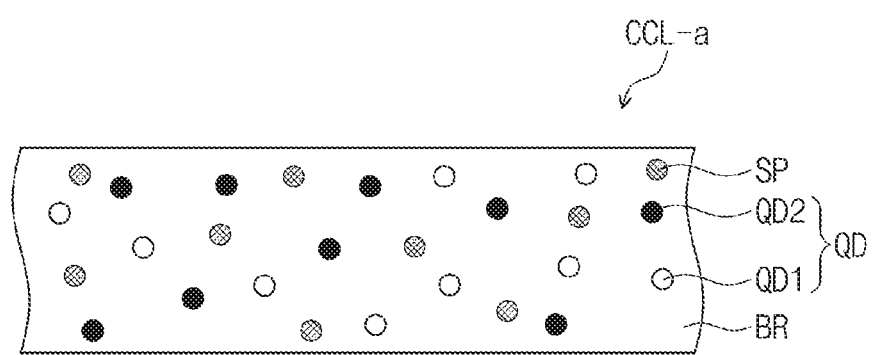
FIG. 12B is a cross-sectional view showing a color conversion layer according to an exemplary embodiment of the inventive concept t.

FIG. 12B is a cross-sectional view showing a color conversion layer CCL-a included in the optical member OM-2 of FIG. 12A. The color conversion layer CCL-a according to an exemplary embodiment may further include scattering particles SP in addition to a base resin BR and at least one quantum dot QD1 or QD2 dispersedly disposed in the base resin BR. The scattered particles SP may be $TiO_2$ or silica-based nanoparticles. The scattered particles SP may scatter the light emitted from the quantum dots QD1 and QD2 to be emitted to the outside the color conversion layer CCL-a.

In other words, as shown in FIG. 12B, if the color conversion layer CCL-a contains a scattered particle SP, the optical member OM-2 according to the exemplary embodiment of FIG. 12A may show improved light uniformity even when the scattering layer SL is omitted, as compared with the optical members OM-1 and OM-1a shown in FIGS. 11A and 11B, FIGS. 13A and 13B are cross-sectional views respectively showing optical members OM-3 and OM-3a according to an exemplary embodiment. FIG. 14 exemplarily shows an optical path in a display device DD-1 of an exemplary embodiment including an optical member OM-3 according to the exemplary embodiment shown in FIG. 13A.

The optical members OM-3 and OM-3a according to an exemplary embodiment may include a pattern layer OPL as an optical path changing layer. The pattern layer OPL may include a plurality of protruding parts OP. The protruding parts OP may be formed protruding from the base substrate BS toward the color conversion layer CCL. The protruding parts OP of the pattern layer OPL may be formed by a mechanical etching, a chemical etching, or the like. In the optical members OM-3 and OM-3a according to the exemplary embodiment shown in FIGS. 13A and 13B, for the base substrate BS, the filter layer FL, the color conversion layer CCL, and the barrier layers BL1 and BL2, the same contents as those described with reference to FIGS. 1 to 10 may be applied.

Figure 13A:
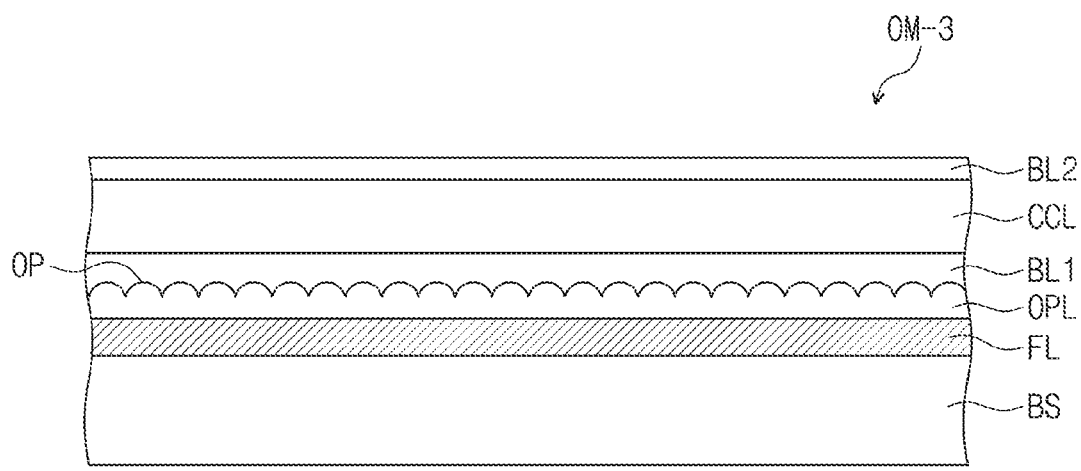
FIG. 13A is a cross-sectional showing an optical member according to an exemplary embodiment of the inventive concept.
Figure 13B:
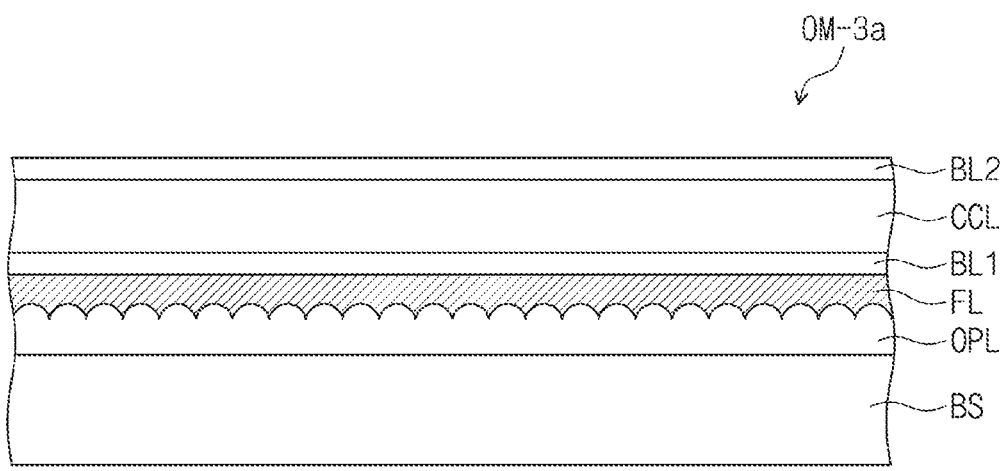
FIG. 13B is a cross-sectional showing an optical member according to an exemplary embodiment of the inventive concept.
Figure 14:
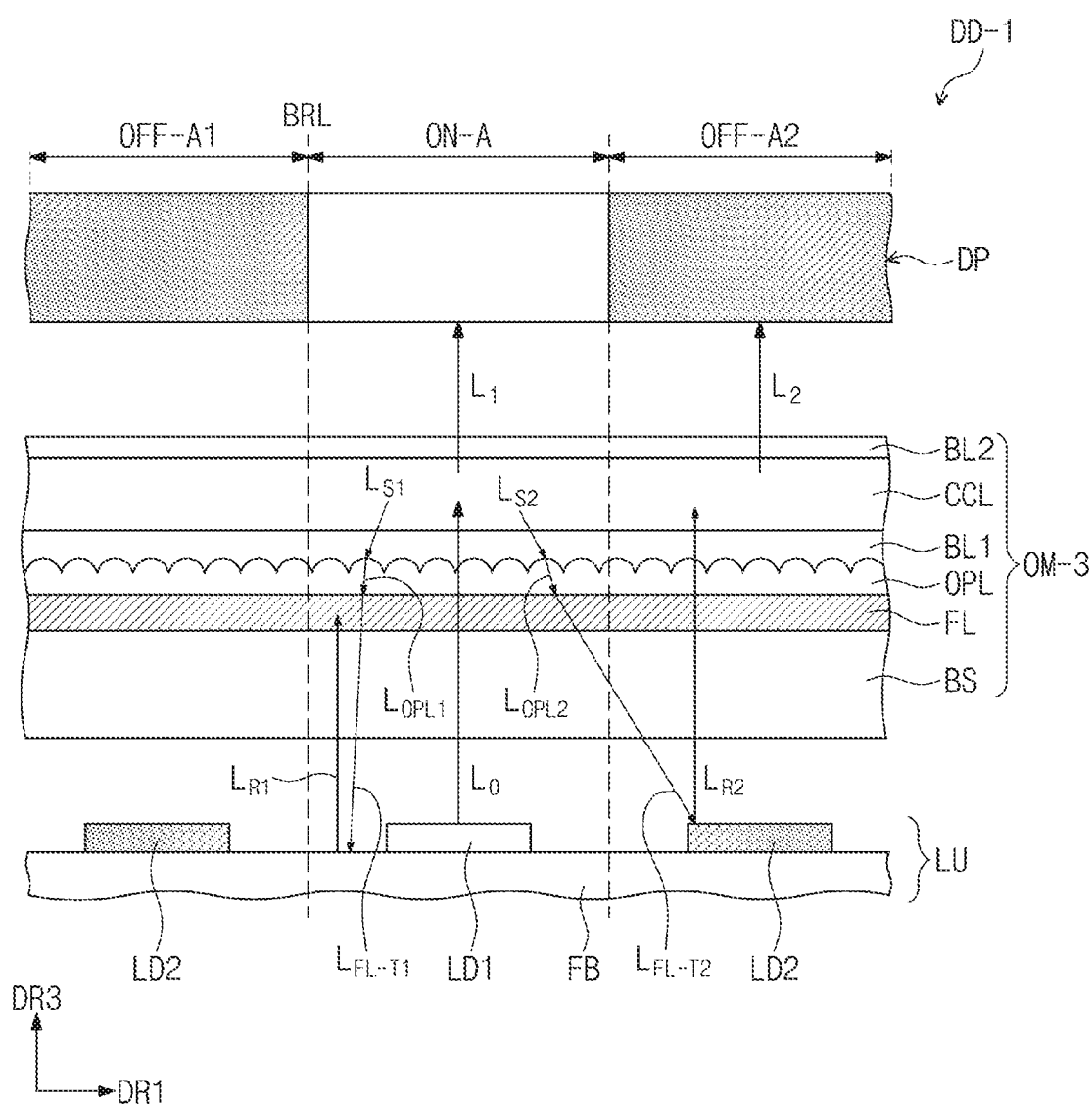
FIG. 14 is a cross-sectional view schematically showing an optical path in a display device according to an exemplary embodiment of the inventive concept.

In the optical members OM-3 and OM-3a according to the exemplary embodiment shown in FIGS. 13A and 13B, the protruding parts OP have a lens shape, but the inventive concept is not limited thereto. The protruding parts OP may be provided in various shapes. The protruding parts OP may be to refract the light incident from the color conversion layer CCL on the pattern layer OPL to change the optical path.

Referring to FIG. 13A, the pattern layer OPL may be disposed between the filter layer FL and the color conversion layer CCL. The pattern layer OPL changes the optical path by refracting light that is emitted from the color conversion layer CCL and directed to the lower part of the color conversion layer CCL so that the incident angle of the light incident on the filter layer FL may be reduced. The pattern layer OPL may allow the light incident on the filter layer FL to have a low angle. Therefore, the filter layer FL may effectively transmit or reflect the incident light, so that the color quality of the display device DD-1 may be improved.

On the other hand, unlike the exemplary embodiment shown in FIG. 13A, FIG. 13B shows a difference in that the pattern layer OPL is disposed on the lower surface of the filter layer FL. If a pattern layer OPL is provided on the lower surface of the filter layer FL, the traveling direction of light passing through the filter layer FL and directed toward the light-emitting unit LU may be reduced to be a low angle, so that it is possible to reduce the amount of light directed to the display areas OFF-A1 and OFF-A2 corresponding to the turned-off light emitting element LD2. Therefore, in the case of using another optical member OM-3a in the exemplary embodiment shown in FIG. 13B, the display quality of the display device DD-1 may be improved.

FIG. 14 schematically shows the optical path in the display device DD-1 of an exemplary embodiment.

The light $L_0$ emitted from the turn-on light emitting element LD1 among the light emitting elements included in the light emitting unit LU passes through the color conversion layer CCL and is provided as the first light $L_1$ to the liquid crystal display panel DP. The first light $L_1$ includes the light $L_0$ emitted from the light emitting element LD1 and the light obtained when the light $L_0$ provided from the light emitting element LD1 is converted in the color conversion layer CCL and provided. The first light $L_1$ may include all of blue light, green light, and red light. That is, the first light $L_1$ may be provided to the liquid crystal display panel DP as white light including all of blue light, green light, and red light.

On the other hand, the light $L_{S1}$, which is a portion of the light scattered in the color conversion layer CCL, may be incident on the pattern layer OPL. The light $L_{S1}$, which is a scattering light incident on the pattern layer OPL, may be refracted at the protruding part of the pattern layer OPL, and may be reduced to have a low angle and incident on the filter layer FL. The light $L_{OPL1}$ passing through the pattern layer OPL is to have a low angle and incident on the filter layer FL and the light $L_{FL-T1}$ transmitted through the filter layer FL is not incident on the area of the turn-off light emitting element LD2 and may be reflected again in the area corresponding to the turned-on light emitting element LD1 and incident on the reflected light $L_{R1}$ again. That is, the pattern layer OPL allows the light scattered in the color conversion layer CCL to have a low angle, and minimizes the amount of light that may be incident on the display area OFF-A1 corresponding to the turn-off light emitting element LD2 so that the display quality may be improved. In addition, on the other hand, the light $L_{S2}$, which is a portion of the light scattered in the color conversion layer CCL, is incident on the pattern layer OPL, and the light $L_{S2}$, which is a scattering light incident on the pattern layer OPL, may be refracted in the protruding part of the pattern layer OPL and incident on the filter layer FL. The light $L_{OPL2}$, which is transmitted through the pattern layer OPL and is incident on the filter layer FL, is transmitted through the filter layer FL, and the transmitted light $L_{FL-T2}$ may be incident on the third display area OFF-A2 where the turned-off light emitting element LD2 is disposed. The light $L_{FL-T2}$ incident on the third display area OFF-A2 may be blue light. On the other hand, a portion of the light $L_{FL-T2}$ light transmitted through the filter layer FL may be reflected by the light emitting unit LU and may be incident again on the color conversion layer CCL as a reflected light $L_{R2}$.

In the reflected light $L_{R2}$ incident on the color conversion layer CCL, the blue light may again excite the quantum dots contained in the color conversion layer CCL. Therefore, the second light $L_2$, which is the light that is transmitted again through the color conversion layer CCL and is provided to the third display area OFF-A2, may include blue light, green light, and red light, and may be a white light whose color balance is matched. In other words, unlike the light $L_2$, that is the second light described with reference to FIG. 9, in FIG. 14, the light $L_2$, which is the second light emitted to the third display area OFF-A2, is a white light that is not changed is to be yellowish, and in the case of the display device DD-1 of this exemplary embodiment, the yellow ring which is a problem in the conventional display device DD' (see FIG. 9) may be improved to show excellent display fineness.

The display device of an exemplary embodiment may display an excellent color quality by disposing an optical member including a color conversion layer having a quantum dot between the light source member and the liquid crystal display panel. In addition, the optical member may display improved display quality by including both the filter layer and the optical path changing layer on the lower side of the color conversion layer.

An exemplary embodiment includes a filter layer provided on the lower side of the color conversion layer and transmitting/reflecting light in a selective wavelength range, and an optical path changing layer provided on an upper surface or a lower surface of the filter layer to change the path of light that is incident on the filter layer or emitted from the filter layer. Therefore, the display quality of the display device having the direct-type light source may be improved.

An exemplary embodiment provides an optical member including a color conversion layer with quantum dots, a filter layer selectively transmitting/reflecting incident light, and an optical path changing layer so that it is possible to provide a display device having an improved display quality.

An exemplary embodiment provides an optical member including a filter layer disposed on an upper side of the light source member and selectively transmitting/reflecting incident light, and an optical path changing layer so that it is possible to provide a display device having an improved display quality.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device comprising:
   a light source member including a circuit board and a plurality of light emitting elements disposed on the circuit board and configured to be turned on and off independently of each other;

an optical member disposed on an upper side of the light source member; and
a liquid crystal display panel disposed on an upper side of the optical member,
wherein:
the optical member comprises:
a base substrate;
a color conversion layer disposed on the base substrate and including a quantum dot for converting the first color light into a second color light and a third color light;
a scattering layer disposed on an upper side of the color conversion layer;
a filter layer disposed between the base substrate and the color conversion layer and transmitting the first color light and reflecting the second color light and the third color light; and
an optical path changing layer disposed directly on at least one of an upper surface and a lower surface of the filter layer;
the scattering layer is disposed closer to the liquid crystal display panel than to the color conversion layer; and
the optical path changing layer is a low refraction layer having a refractive index smaller than that of the color conversion layer.

2. The display device of claim 1, wherein:
the low refraction layer comprises a low refractive index material; and
the low refractive index material comprises at least one of voids, hollow inorganic particles, porous silica particles, or siloxane polymers.

3. The display device of claim 1, wherein:
the low refraction layer is a metal layer formed of a metal material of Ag, Al, Cu, or Au, or an alloy of the metal materials; and
a thickness of the metal layer is greater than or equal to 30 Å and less than or equal to 100 Å.

4. The display device of claim 3, wherein the metal layer is a single layer.

5. The display device of claim 1, wherein the optical path changing layer is a pattern layer including a plurality of protruding parts.

6. The display device of claim 5, wherein the protruding parts protrude from the base substrate toward the color conversion layer.

7. The display device of claim 1, wherein:
the filter layer comprises a plurality of first insulating films;
a plurality of second insulating films disposed alternately with the first insulating films; and
refractive indices of the first insulating films and the second insulating films are different from each other.

8. The display device of claim 7, wherein:
the refractive index of the first insulating films is greater than or equal to 1.4 and less than or equal to 1.6; and
the refractive index of the second insulating films is greater than or equal to 1.9 and less than or equal to 2.1.

9. The display device of claim 1, wherein the optical member further comprises a barrier layer disposed on at least one of an upper surface and a lower surface of the color conversion layer.

10. The display device of claim 1, wherein the scattering layer comprises a scattered particle of at least one of $TiO_2$, $SiO_2$, ZnO, $Al_2O_3$, $BaSO_4$, $CaCO_3$, and $ZrO_2$.

11. The display device of claim 1, wherein:
a center wavelength of the first color light is in a range of 420 nm to 470 nm, inclusive;
a center wavelength of the second color light is in a range of 520 nm to 570 nm, inclusive; and
a center wavelength of the third color light is in a range of 620 nm to 670 nm, inclusive.

12. A display device comprising:
a light source member including a circuit board and a plurality of light emitting elements disposed on the circuit board and configured to be turned on and off independently of each other;
an optical member disposed on an upper side of the light source member; and
a liquid crystal display panel disposed on an upper side of the optical member,
wherein:
the optical member comprises:
a base substrate;
a color conversion layer disposed on the base substrate and including a quantum dot;
a scattering layer disposed on an upper side of the color conversion layer;
a filter layer disposed between the base substrate and the color conversion layer and configured to transmit light having a central wavelength in a range of 420 nm to 470 nm, inclusive, among an incident light and reflect light having a center wavelength in a range of 520 nm to 670 nm, inclusive; and
an optical path changing layer disposed directly on at least one of an upper surface and a lower surface of the filter layer;
the scattering layer is disposed closer to the liquid crystal display panel than to the color conversion layer; and
the optical path changing layer is a low refraction layer having a refractive index smaller than that of the color conversion layer.

13. The display device of claim 12, wherein the filter layer reflects 80% or more of light having a center wavelength in a range of 520 nm to 670 nm, inclusive, among light incident in a normal direction of the upper surface or the lower surface.

14. The display device of claim 12, wherein the low refraction layer having the refractive index greater than or equal to 0.1 and less than or equal to 1.4 or a pattern layer containing a plurality of protruding parts.

15. A display device comprising:
an optical member;
a light source member disposed on a lower side of the optical member and including a plurality of light emitting units for providing blue light to the optical member; and
a liquid crystal display panel disposed on an upper side of the optical member,
wherein:
the optical member comprises:
a base substrate;
a color conversion layer disposed on the base substrate and including a first quantum dot excited by the blue light to emit green light and a second quantum dot excited by the blue light to emit red light;
a scattering layer disposed on an upper side of the color conversion layer;
a filter layer disposed between the base substrate and the color conversion layer to transmit the blue light and reflect the green light and the red light; and
an optical path changing layer disposed directly on at least one of an upper surface and a lower surface of the filter layer;

the plurality of light emitting units comprise:
  a circuit board; and
  a plurality of light emitting elements disposed on the circuit board and configured to be turned on and off independently of each other;
the scattering layer is disposed closer to the liquid crystal display panel than to the color conversion layer; and
the optical path changing layer is a low refraction layer having a refractive index smaller than that of the color conversion layer.

16. The display device of claim 15, wherein the optical path changing layer is a pattern layer including a plurality of protruding parts protruding from the base substrate toward the color conversion layer.

* * * * *